(12) United States Patent
Sedillo et al.

(10) Patent No.: US 9,144,168 B2
(45) Date of Patent: Sep. 22, 2015

(54) APPENDAGE-MOUNTED DISPLAY APPARATUS

(71) Applicant: The United States of America, as represented by the Secretary of the Air Force, Washington, DC (US)

(72) Inventors: Michael R. Sedillo, Dayton, OH (US); Gregory M. Burnett, Dayton, OH (US)

(73) Assignee: The United States of America, as represented by the Secretary of the Air Force, Washington, DC (US)

( * ) Notice: Subject to any disclaimer, the term of this patent is extended or adjusted under 35 U.S.C. 154(b) by 97 days.

(21) Appl. No.: 13/790,221

(22) Filed: Mar. 8, 2013

(65) Prior Publication Data
US 2013/0235546 A1    Sep. 12, 2013

Related U.S. Application Data

(60) Provisional application No. 61/608,497, filed on Mar. 8, 2012, provisional application No. 61/609,899, filed on Mar. 12, 2012.

(51) Int. Cl.
| | |
|---|---|
| *A45F 5/00* | (2006.01) |
| *A44C 5/00* | (2006.01) |
| *A44C 5/14* | (2006.01) |
| *A45F 3/14* | (2006.01) |
| *H05K 7/02* | (2006.01) |
| *G06F 1/16* | (2006.01) |

(52) U.S. Cl.
CPC .. *H05K 7/02* (2013.01); *A45F 5/00* (2013.01); *G06F 1/163* (2013.01); *A45F 2005/008* (2013.01); *A45F 2200/0516* (2013.01); *A45F 2200/0566* (2013.01)

(58) Field of Classification Search
CPC .............................. A45F 2005/008; A45F 5/00
USPC ......... 224/267, 164, 165, 167, 172, 179, 219, 224/221–222
See application file for complete search history.

(56) References Cited

U.S. PATENT DOCUMENTS

| | | | |
|---|---|---|---|
| 230,759 A | 8/1880 | Drummond | |
| 1,090,438 A | 3/1914 | Worth et al. | |
| 2,200,147 A * | 5/1940 | Bouges | .......................... 224/222 |
| 2,611,940 A | 9/1952 | Cairns | |
| 2,991,523 A | 7/1961 | Del Conte | |

(Continued)

FOREIGN PATENT DOCUMENTS

IT    PCTEP2006066684    4/2007

*Primary Examiner* — Brian D Nash
*Assistant Examiner* — Derek Battisti
(74) *Attorney, Agent, or Firm* — AFMCLO/JAZ; Jason Sopko

(57) ABSTRACT

An appendage-mounted display apparatus comprising a device mount for attaching electronic devices and a cuff assembly that provides a uniform tension fit around a user's appendage. The cuff assembly comprises a multi-layer blend of soft and rigid components and a ratcheting lacing or strap system to achieve a customizable, non-slip fit that may be quickly and easily adjusted with one hand. The device mount may be adapted to accommodate a variety of electronic devices including mobile phones, smartphones, and other communication devices, portable computers, maps, audio and music devices, global positioning system devices, and other interactive electronic devices and displays, as well as paper maps, checklists, and other static forms of guidance and instruction. In addition, the device mount may include a rail system for attaching a flashlight and/or other tools.

11 Claims, 6 Drawing Sheets

(56) References Cited

U.S. PATENT DOCUMENTS

| | | | |
|---|---|---|---|
| 3,197,155 A | 7/1965 | Chow | |
| 3,729,779 A | 5/1973 | Porth | |
| 4,741,115 A | 5/1988 | Pozzoban | |
| 4,864,658 A | 9/1989 | Russell et al. | |
| 4,961,544 A | 10/1990 | Bidoia | |
| 5,183,193 A * | 2/1993 | Brandell | 224/219 |
| 5,305,181 A | 4/1994 | Schultz | |
| 5,309,328 A * | 5/1994 | Lum | 361/809 |
| 5,318,371 A * | 6/1994 | Niewulis | 401/6 |
| 5,416,730 A | 5/1995 | Lookofsky | |
| 5,657,201 A | 8/1997 | Kochis | |
| 6,212,414 B1 | 4/2001 | Alameh et al. | |
| 6,289,558 B1 | 9/2001 | Hammerslag | |
| 6,330,961 B1 | 12/2001 | Borja | |
| 6,564,075 B1 | 5/2003 | Mitamura | |
| 6,567,523 B1 | 5/2003 | Ghassabian | |
| 6,648,502 B2 | 11/2003 | Oomori et al. | |
| 6,757,389 B2 | 6/2004 | Firooz | |
| 6,796,708 B2 | 9/2004 | Kawamata et al. | |
| 7,243,824 B2 | 7/2007 | Tabata | |
| 7,534,206 B1 | 5/2009 | Lovitt et al. | |
| 7,950,112 B2 | 5/2011 | Hammerslag et al. | |
| 7,954,204 B2 | 6/2011 | Hammerslag et al. | |
| 7,992,261 B2 | 8/2011 | Hammerslag et al. | |
| 8,091,182 B2 | 1/2012 | Hammerslag et al. | |
| 8,099,794 B2 | 1/2012 | Carstens | |
| 8,140,131 B1 | 3/2012 | Green | |
| D664,259 S * | 7/2012 | Joseph | D24/192 |
| 8,277,401 B2 | 10/2012 | Hammerslag et al. | |
| 8,622,262 B2 * | 1/2014 | Van Art | 224/148.2 |
| 2005/0198866 A1 | 9/2005 | Wiper et al. | |
| 2006/0166720 A1* | 7/2006 | Dixon | 455/575.6 |
| 2007/0029357 A1 | 2/2007 | Chao et al. | |
| 2008/0047990 A1* | 2/2008 | Morgan et al. | 224/222 |
| 2008/0060167 A1 | 3/2008 | Hammerslag et al. | |
| 2008/0066272 A1 | 3/2008 | Hammerslag et al. | |
| 2008/0319362 A1* | 12/2008 | Joseph | 602/7 |
| 2009/0061958 A1 | 3/2009 | Osgood | |
| 2009/0184189 A1 | 7/2009 | Soderberg et al. | |
| 2010/0176166 A1* | 7/2010 | Siagri et al. | 224/271 |
| 2010/0299959 A1 | 12/2010 | Hammerslag et al. | |
| 2011/0225843 A1 | 9/2011 | Kerns et al. | |
| 2011/0266384 A1 | 11/2011 | Goodman et al. | |
| 2011/0270469 A1 | 11/2011 | Bopp et al. | |
| 2012/0000091 A1 | 1/2012 | Cotterman et al. | |
| 2012/0004587 A1 | 1/2012 | Nickel et al. | |
| 2012/0246974 A1 | 10/2012 | Hammerslag et al. | |
| 2012/0255978 A1* | 10/2012 | Williams | 224/219 |

\* cited by examiner

APPENDAGE-MOUNTED DISPLAY APPARATUS

CROSS-REFERENCE TO RELATED APPLICATIONS

This application claims the benefit of U.S. Provisional Application No. 61/608,497, filed on Mar. 8, 2012, entitled "Modular Appendage Mountable Information Display," and U.S. Provisional Application No. 61/609,899, filed on Mar. 12, 2012, entitled "Universal Arm Mount Carriage for Interactive and Static Technologies," both of which are herein incorporated by reference in their entirety.

RIGHTS OF THE GOVERNMENT

The invention described herein may be manufactured and used by or for the Government of the United States for all governmental purposes without the payment of any royalty.

BACKGROUND OF THE INVENTION

1. Field of the Invention

This invention relates generally to the field of wearable electronic technology. More particularly, it relates to an appendage-mounted display apparatus that provides a uniform tension fit.

2. Description of the Related Art

Portable or wearable electronic mounting platforms allow a user to easily affix a variety of electronic devices to his or her body for easy access and hands-free use. Users engaged in physical activity may benefit from many of the image and information processing features that are available in portable electronic devices, particularly commercially available smartphones and global positioning system (GPS) devices. For example, mobile infantry units may gain enhanced capabilities from electronically displayed maps, real-time satellite or Unmanned Aerial Vehicle imagery, photographs of high value targets, statistical or environmental data and ballistic calculations, etc. Such portable electronic devices may also benefit mountain bikers, snowboarders, extreme sports enthusiasts, hunters, active sports enthusiasts, and users of social media applications. These users may benefit from trail maps, GPS-guided navigation to points of interest, video or still photography of the user in motion, recordation of acceleration and velocity, real-time photographs and video, and countless other activity-specific applications. Both groups of users, military and civilian, may also take advantage of static technology such as printed reference materials, maps, etc.

Conventional wrist- and arm-mounted displays frequently use adjustable attachment means to affix the display platform to the user's body such as one or more watch band-type closure straps, shoelace-type closures, or one or more hook-and-eye closure straps such as Velcro®, while other display platforms are preformed into a rigid "C" or "U" shape designed to fit the diameter of an average human wrist or arm.

These conventional display platforms and mounts share a number of problems. Two of the most common issues are the lack of a truly customizable fit and slippage, particularly where the mounted electronic device is large or asymmetric. While watch band-, shoelace-, and hook-and-eye type closures allow a user to adjust the circumference, the attachment means is generally unable to provide a uniformly tight fit across all areas of the user's forearm. Both types of conventional display platforms, adjustable and preformed, are also generally unable to fully accommodate persons with unusually large or small arms or persons wearing unusually thick or thin clothing. Disparate levels of tightness may cause discomfort to the user, restrict the user's movement, and/or interfere with blood circulation in the arm and hand. In addition, when the user turns or moves his or her arm, the display platform may rotate out of place so that the user must continuously pull the display platform back into place for easy viewing. Finally, many of the currently available adjustable attachment means require two hands to fully tighten the straps and often require that the user cease activity to adjust the display platform.

SUMMARY OF THE INVENTION

The present invention provides a system for appendage-wearable mounting of personal electronic devices or printed reference materials. The system allows user-configurable exchange of components suitable for mounting various models of electronic devices, as well as components suitable for securing backlit and non-illuminated printed reference materials. The present invention provides superior user accessibility, comfort, ruggedness, light weight construction, varied adjustability, and positive retention when secured.

The present invention includes an appendage-mounted display apparatus for mounting on a user's appendage, the appendage-mounted display apparatus comprising an upper panel comprising an upper cage, a base plate, upper structural mesh-coated foam, and an upper grip; a lower panel comprising a lower cage, lower structural mesh-coated foam, a lower grip, and a closed-loop tensioning system coupled to a lower panel exterior surface, in which the lower panel is configured to fit within the upper panel such that at least a portion of the upper panel overlaps over an outside surface of the lower panel, with the closed-loop tensioning system being configured to pull the upper panel and the lower panel substantially radially inward toward the user's appendage such that a uniform level of compressive force about the user's appendage is achieved; and a device mount that is coupled to an upper panel exterior surface and further coupled to the base plate.

In one embodiment, a combination of the upper panel and the lower panel forms a substantially frustoconical geometry. In a further embodiment, the upper cage and upper mesh-coated structural foam further comprise a plurality of guide clamps and the closed-loop tensioning system further comprises a plurality of laces and a tensioning knob, in which the laces are coupled to the tensioning knob and to the lower panel and the upper panel, with the laces being routed through the guide clamps and the laces being configured such that the upper panel and lower panel concentrically tighten or loosen around a user's appendage when the tensioning knob is turned. In an alternative embodiment, the closed-loop tensioning system comprises a rack and pinion assembly.

In another embodiment of the appendage-mounted display apparatus, the device mount further comprises a smartphone mount.

In an alternative embodiment, the device mount further comprises a map module assembly. In one embodiment, the map module assembly is flat. In another embodiment, the map module assembly is curved. In a further embodiment, the map module assembly comprises optics. In yet another embodiment, the map module assembly further includes a map cover that is hingeably coupled to at least one portion of the map mount.

In a further embodiment, the device mount further comprises a rail system.

DETAILED DESCRIPTION OF THE INVENTION

Figure 1:
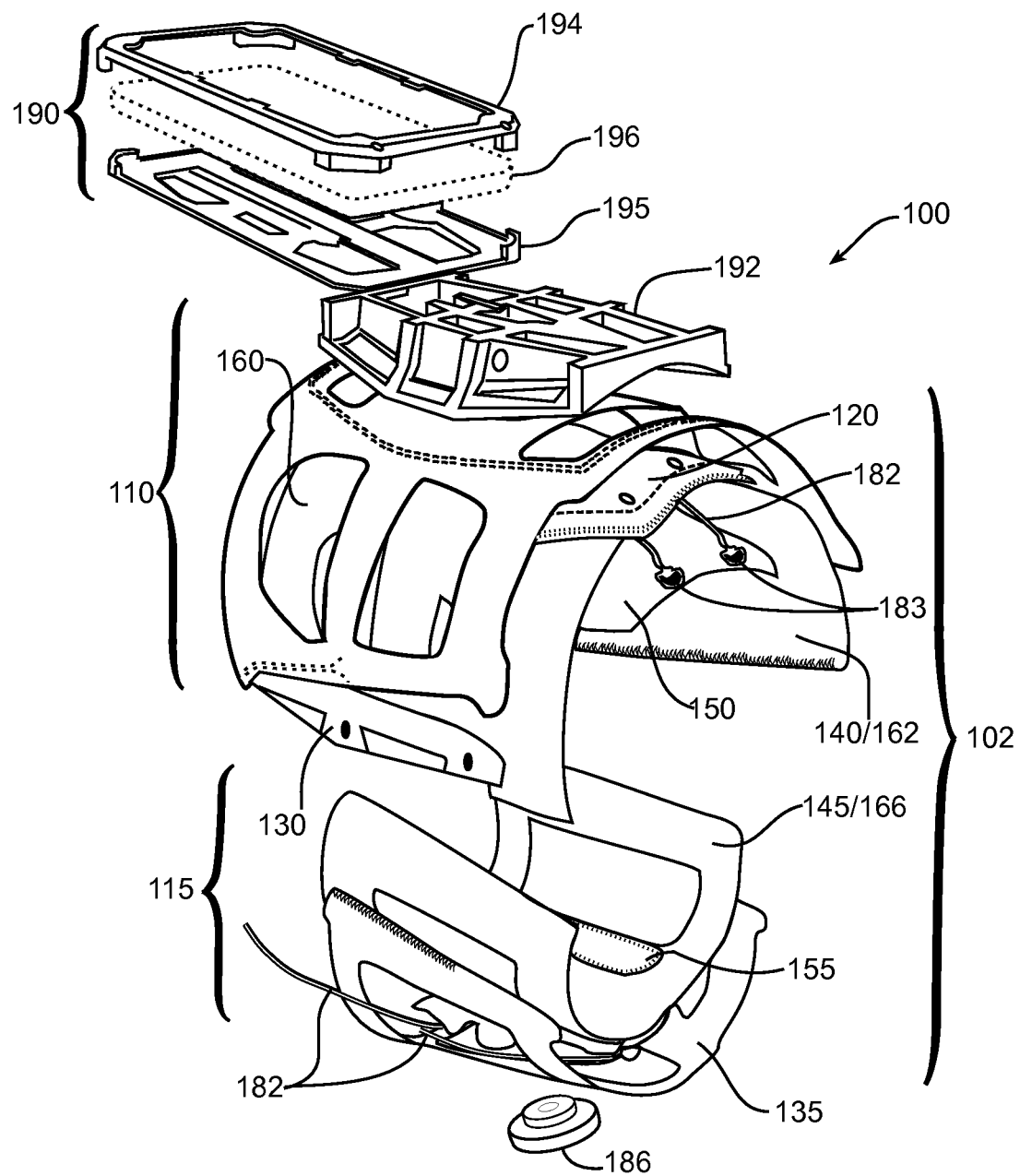
FIG. 1 is an exploded view of one embodiment of an appendage-mounted display apparatus comprising a device mount and a cuff assembly.

The present invention includes an appendage-mounted display apparatus comprising a cuff assembly that provides a uniform tension fit around the user's appendage and a modular device mount for attaching electronic devices. The cuff assembly uses a multi-layer blend of soft and rigid components and a tensioning system to achieve a customizable, non-slip fit that may be quickly and easily adjusted with one hand. The modular device mount may be adapted to accommodate a variety of electronic devices including mobile phones, smartphones, and other communication devices, portable computers, maps, audio and music devices, global positioning system devices, and other interactive electronic devices and displays, as well as paper maps, checklists, and other static forms of guidance, instruction, and reference materials. In addition, the device mount may include a rail system for attaching a flashlight and/or other tools.

The present invention may be useful to the warfighter engaged in movements on the ground, air, and sea, as well to technicians servicing military platforms and systems and other military and government personnel requiring hands-free access to communication, instructional, and navigation devices. In addition, the present invention may be useful for individuals engaged in recreational activities such as walking, running, hiking, skiing, biking, scuba diving, and other activities where hands-free access to mobile device content is desirable. Finally, the present invention may be useful to workers in skilled trade and service industries, medical workers and first responders, and others who require ready access to hands-free communication devices and reference materials.

Referring to the drawings, like reference numerals may designate like or corresponding parts throughout the several views. In some figures, portions of the appendage-mounted display apparatus are omitted or not labeled in order to illustrate certain aspects of the invention in detail. These variations should in no way be interpreted as limiting the scope of the invention.

FIG. 1 is an exploded view of one embodiment of the appendage-mounted display apparatus 100 comprising a cuff assembly 102 and a device mount 190. The cuff assembly 102 further comprises an upper panel 110 and a lower panel 115. The upper panel 110 comprises an upper cage 130, upper structural foam 140, and an upper grip 150. The upper structural foam 140 is covered on both sides by a mesh layer (not separately labeled), which may also comprise antimicrobial mesh on an interior surface of the upper structural foam 140 that faces the user's appendage. The upper panel 100 further comprises a base plate 120 for attaching the device mount 190 to the appendage-mounted display apparatus 100. The outer edges of the upper cage 130 and upper structural foam 140 further comprise two or more guide clamps 170 that are coupled to the upper cage 130 and upper structural foam 140.

The lower panel 115 comprises a lower cage 135, lower structural foam 145, and a lower grip 155. The lower structural foam 145 is covered on both sides by a mesh layer (not separately labeled), which may also comprise antimicrobial mesh on an interior surface of the lower structural foam 145 that faces the user's appendage. The lower panel 115 is situated with respect to the upper panel 110 such that the lower panel 115 is nested substantially concentrically within the open ends of the upper cage 130 and upper structural foam 140. The ends of the upper panel 110 will slightly overlap the ends of the lower panel 115, forming a substantially frusto-conical geometry.

The lower panel 115 of the cuff assembly 102 further comprises a tensioning system 180 that secures the upper panel 110 to the lower panel 115. As described in more detail in FIG. 2, the embodiment of the tensioning system 180 depicted in FIG. 1 comprises laces 182, a lace guide (not labeled), and a tensioning knob 186. The laces 182 are coupled to and pass through the lace guide at various points to position the laces 182 at various points along the length of the cuff assembly 102. The laces 182 wrap around the outside of the lower panel 115 and enter the guide clamps 170 located on the outer edges of the upper cage 130 and/or upper structural foam 140. The guide clamps 170 route the laces 182 into and around the upper panel 110. The laces 182 may be located beneath the upper cage 130 or may be integral with the upper cage 130 or any other component of the cuff assembly 102. The laces 182 pass through holes in the base plate 120 and may be coupled to the upper panel 110 via attach points 183 located on the upper grip 150. In alternative embodiments, the laces 182 may be coupled to attach points 183 located on other components of the cuff assembly 102. The tensioning system 180 provides a closed loop system that allows a user to attach and remove the appendage-mounted display apparatus 100 without disassembling the components. Depending on the orientation and location of the cuff assembly 102 with respect to the user's body, the tensioning system 180 may be located in any orientation that is readily accessible by the user.

Because the cuff assembly 102 may be worn by a user for many hours at a time, materials and structure are selected to provide an appropriate balance between comfort, ruggedness, weight of construction, and secure mounting. The multi-layer blend of softer materials such as the upper and lower structural foam 140, 145 alternating with more rigid materials such as the upper and lower cages 130, 135 allows the appendage-mounted display apparatus 100 to provide a non-slip fit. As one of ordinary skill in the art will readily recognize, materials utilized in the disclosed invention are not limited only to the disclosed materials and fabrics and may be varied to achieve different performance characteristics. In addition, as one of ordinary skill in the art will recognize, the cuff assembly 102 may be appropriately scaled to interface with a variety of appendages, including the user's forearm, upper arm, thigh, or calf.

Because the upper and lower cages 130, 135 protect the inner layers and provide a durable layer for the tensioning system, the upper and lower cages 130, 135 may comprise a more rugged, abrasion-resistant material that still retains a suitable degree of flexibility and elasticity. Examples of suitable materials may include vinyl diamond fabric, thermoplastic polyurethane, or other suitable thermoplastic elastomer. The upper and lower cages 130, 135 may also comprise a material that may be laser cut to provide a high degree of precision, while simultaneously fusing together the fibers of the cut end. The upper and lower structural foam 140, 145 may comprise a material such as laminated ethylene vinyl acetate (EVA) foam to provide a structured material that is both durable and comfortable. The mesh layers covering the upper and lower structural foam 140, 145 reduce the total surface area of the contact surface, increasing breathability and comfort, while wicking away moisture and decreasing weight. An example of a suitable mesh material includes a nylon-polyester blend. Antimicrobial mesh material such as Dri-Lex® Aerospacer® fabric may also be used to inhibit bacterial and/or mold growth.

The upper and lower grips 150, 155 allow the appendage-mounted display apparatus 100 to firmly and securely grip the user's appendage with and without clothing, which prevents rotation, slippage, and other undesirable movement of the cuff assembly 102. The upper and lower grips 150, 155 may comprise a material such as Toughtek® non-slip neoprene or rubberized fabric and/or mesh. The guide clamps 170 and the lace guides may comprise a polycarbonate-polyester blend such as polycarbonate/polybutylene terepthalate (PC/PBT) blend or other suitable impact-, chemical-, and heat-resistant polymer or polymer blend. The components of the upper and lower panel 110, 115 may be assembled using any means known in the art, including snap-fit recessed fittings or grommets.

The appendage-mounted display apparatus 100 further comprises a device mount 190, which is a common interface, modular mechanism for transporting, interacting with, and wearing an electronic device, static display, and/or tool(s) with the cuff assembly 102. The device mount 190 may comprise a PC/PBT blend or other suitable impact-, chemical-, and heat-resistant polymer or polymer blend. The device mount 190 may be adapted to fit a variety of devices, and in the exemplary embodiment depicted in FIG. 1, the device mount 190 comprises a phone mount comprising an upper receiver 194 and a lower receiver 195 that are designed to accommodate a smartphone 196. The lower receiver 195 includes a mounting feature (not labeled) that detachably couples the lower receiver 195 to the device mount 190. Some embodiments of the mounting feature and device mount 190 utilize an interference fit between components, while other embodiments may use a locking button or lever to facilitate coupling and decoupling the phone mount from the device mount 190. Existing commercial electronic products, other than the smartphone 196 depicted in FIG. 1, may be coupled to the device mount 190 by means of variously dimensioned cage components. In some embodiments, electronic devices specifically designed to mate with the device mount 190 may incorporate a mounting feature directly on the rear surfaces of the device's chassis, which allows a direct connection without the use of an upper and lower receiver 194, 195.

The device mount 190 is coupled to the base plate 120, which provides a large, stable, universal mounting point for various embodiments of the device mount 190. The device mount 190 may be coupled to the base plate 120 using any means known in the art, including mechanical fasteners such as thumb screws as wells as use of adhesive or thermal or chemical fusion of the components. The base plate 120 is integrated into the upper cage 130 and may comprise a PC/PBT blend or other suitable impact-, chemical-, and heat-resistant polymer or polymer blend.

Figure 2:
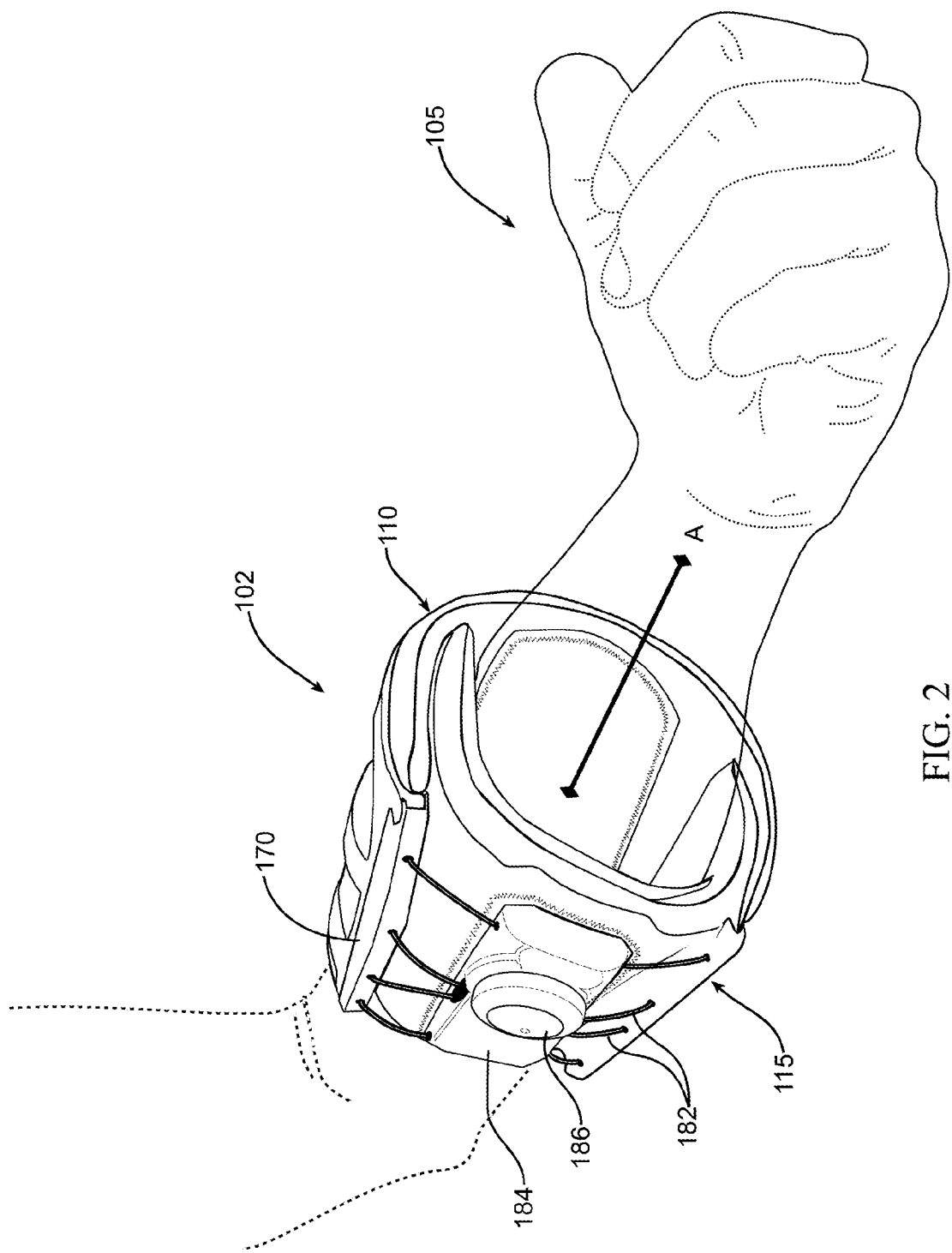
FIG. 2 is a perspective view of one embodiment of the cuff assembly affixed to a user's forearm.

FIG. 2 is a side view of the cuff assembly 102 mounted on a user's (left) forearm 105, with a user's forearm having an axis A. When assembled, the lower panel 115 is designed to fit within the upper panel 110 such that the outer edges of the upper panel 110 overlap the outer edges of the lower panel 115. A tensioning system 180 comprises a lace guide 184, laces 182, and a tensioning knob 186. The laces 182 are coupled to and pass through the lace guide 184 in a plurality of locations, creating a zigzag pattern. The lace guide 184 is a housing that routes the laces 182 to various points on the guide clamp 170, where the laces enter the upper panel 110. One end of the laces 182 are coupled to the tensioning knob 186 inside the lace guide 184. As shown in FIG. 1, the other end of the laces 182 terminates at a plurality of attach points 183 on the upper grip 150.

When the tensioning knob 186 is turned one direction, the laces 182 are pulled uniformly toward the lace guide 184, moving the upper panel 110 and lower panel 115 uniformly toward each other and increasing the compressive force between the cuff assembly 102 and the user's forearm 105. The lower panel 115 moves freely within the upper panel 110 so that when the laces 182 are tightened, the lower panel 115 moves toward the user's forearm 105 in a motion that is substantially perpendicular to axis A to tighten the cuff assembly 102 about the user's forearm 105. This uniform motion results in a substantially concentric compression pattern which provides a uniform application of force and friction to the user's forearm 105 in a manner that is largely independent of forearm geometry. In one embodiment, the tensioning knob 186 comprises a ratchet mechanism or friction adjustment, which prevents a user-selected tension from being inadvertently adjusted by impact or contact with foreign objects. Likewise, when the tensioning knob 186 is turned in the opposite direction, the laces 182 are uniformly released from the lace guide 184 to allow the upper panel 110 and lower panel 115 to uniformly move away from each other, thereby loosening the cuff assembly 102 and decreasing the compressive force between the cuff assembly 102 and the user's forearm 105. An example of a suitable tensioning system 180 includes the Boa® Closure System by Boa Technology.

The pattern and distribution of the laces 182 through the upper panel 110 and lower panel 115 provide uniform tension (i.e. compressive force) around the user's forearm 105, which allows the appendage-mounted display apparatus 100 to conform to persons having appendages of different shape, size, and musculature, as well as persons wearing different types and amounts of clothing. While the use of the appendage-mounted display apparatus 100 may limit some finer radial arm movement, the use of the tensioning system 180 allow for very fine adjustments of the cuff assembly 102 to achieve a truly customized fit for each user, which reduces user discomfort and decreases interference with blood circulation in the user's forearm 105.

Figure 3:
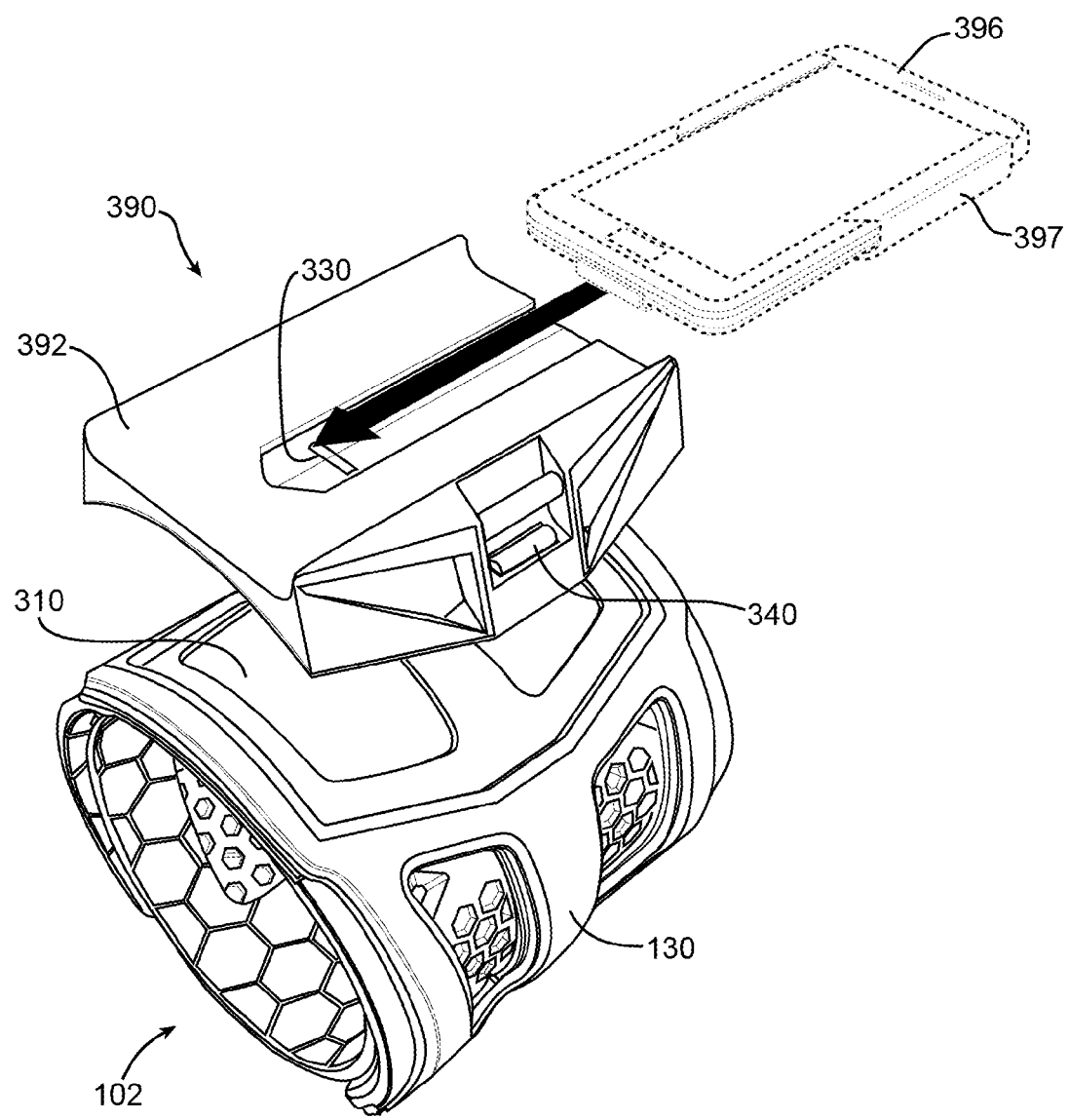
FIG. 3 is a perspective view of one embodiment of a cuff assembly with an alternative embodiment of a smartphone mount.

FIG. 3 is a partially exploded view of another embodiment of an appendage-mounted display apparatus 100 comprising a cuff assembly 102 and a device mount 390. The device mount 390 depicted in FIG. 3 comprises a smartphone mount 392 configured to receive a smartphone 396. The smartphone clip 397 is designed to conform to the dimensions of the smartphone 396 such that the smartphone 396 detachably snaps into the smartphone clip 397. The upper cage 130 of the cuff assembly 102 further comprises a smartphone platform 310 designed to receive the smartphone mount 392. The smartphone clip 397 is configured to be slidably coupled to the smartphone mount 392 by sliding the smartphone clip 395 in a direction 320 into the smartphone mount 392 until the smartphone clip 397 engages a slot 390 in the smartphone mount 392. The smartphone clip 397 may be released from the smartphone mount 392 by pressing the quick release tab 340, which disengages the smartphone clip 397 from the slot 390.

Figure 4:
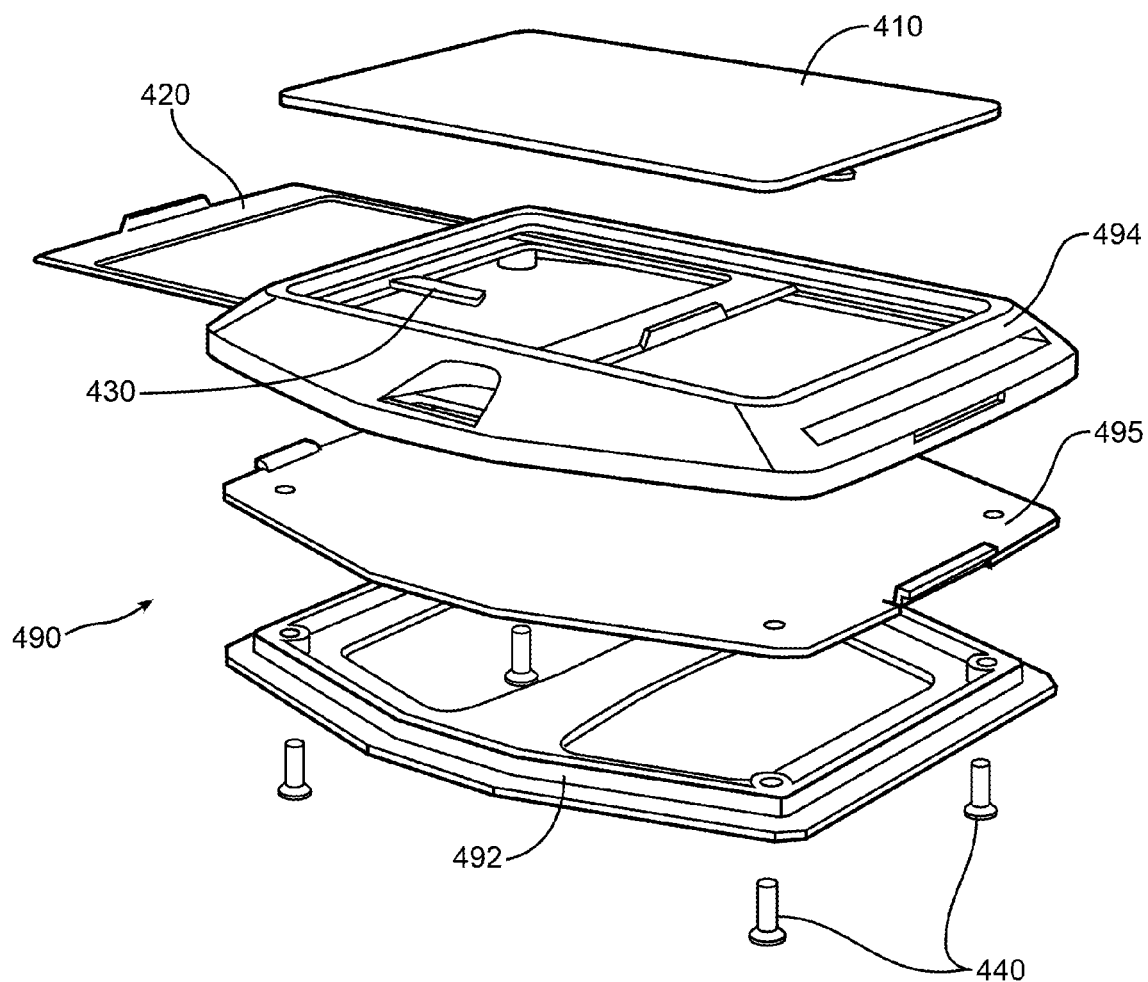
FIG. 4 is an exploded view of one embodiment of a map module assembly.
Figure 5:
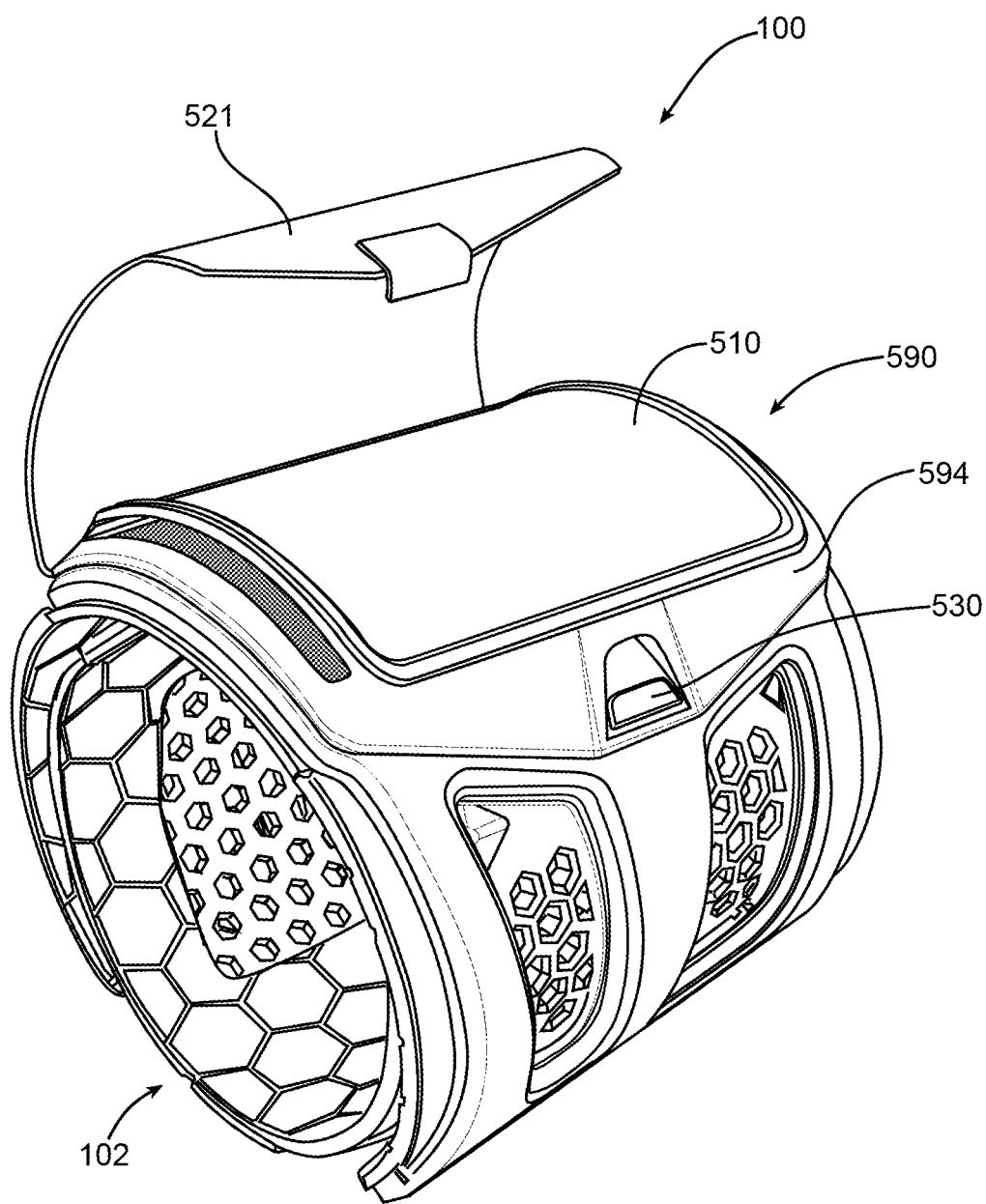
FIG. 5 is a perspective view of another embodiment of a map module assembly attached to a cuff assembly.

FIGS. 4 and 5 illustrate additional embodiments of a device mount further comprising a map module assembly. FIG. 4 is an exploded view of one embodiment of a flat map module assembly 490 comprising a transparent lens cover 410, a map loading drawer 420, an upper map receiver 494, a lower map receiver 495, a map mount 492, and screws 440 or other means of attaching the components of the flat map module assembly 490. Maps, instruction cards, checklists, etc. may be loaded into the map loading drawer 420 and quickly changed out as needed. The transparent lens cover 410 may provide a fully or partially weather-tight seal with the map module assembly 490 to protect the contents of the map loading drawer 420. The flat map module assembly 490 may further comprise a light-emitting diode (LED) light source (not labeled), which may be activated by pressing an LED button 430. The LED light source allows for easy viewing of maps in low light situations. The flat map module assembly 490 may further comprise a cover (not shown) that is coupled to a portion of the cuff assembly 102. A person of ordinary skill in the art will appreciate that the flat map module assembly 490 may be modified to accommodate a smartphone, GPS unit, or other electronic device to provide more protection for the device and a more secure attachment to the cuff assembly 102.

FIG. 5 is a perspective view of one embodiment of an appendage-mounted display apparatus 100 comprising a cuff assembly 102 and a curved map module assembly 590. Similar to the map module assembly 490 of FIG. 4, the curved map module assembly 590 comprises a curved transparent lens cover 510, a map loading drawer (not labeled), a curved upper map receiver 594, a curved lower map receiver (not labeled), a curved map mount (not labeled), and screws (not shown) or other means of attaching the components of the curved map mount assembly 590. The curved map module assembly 590 is curved so that it has a lower profile and conforms more closely to the user's appendage (not shown). The curved map mount assembly 590 may further comprise an LED or other light source (not shown) that may be activated by pressing the LED button 530. The curved map module assembly 590 may further comprise a cover 521, which is hingeably coupled to a portion of the cuff assembly 102. The cover 521 may be clear or fully or partially opaque. The curved transparent lens cover 510 and/or the cover 521 may provide a fully or partially weather-tight seal with the map module assembly 490 to protect the contents of the map loading drawer and the curved map module assembly 590. In addition, a fully or partially opaque cover 521 may shield others' view of the map contents and/or conceal light emanating from the light source.

Figure 6A:
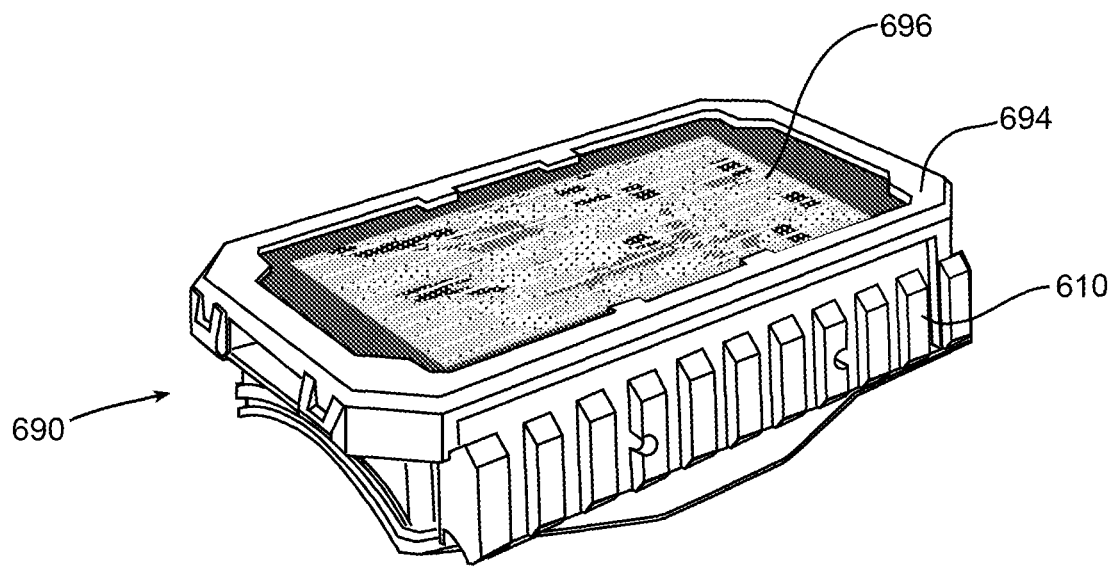
FIGS. 6A and 6B are perspective views of one embodiment of a device mount further comprising a rail system.
Figure 6B:
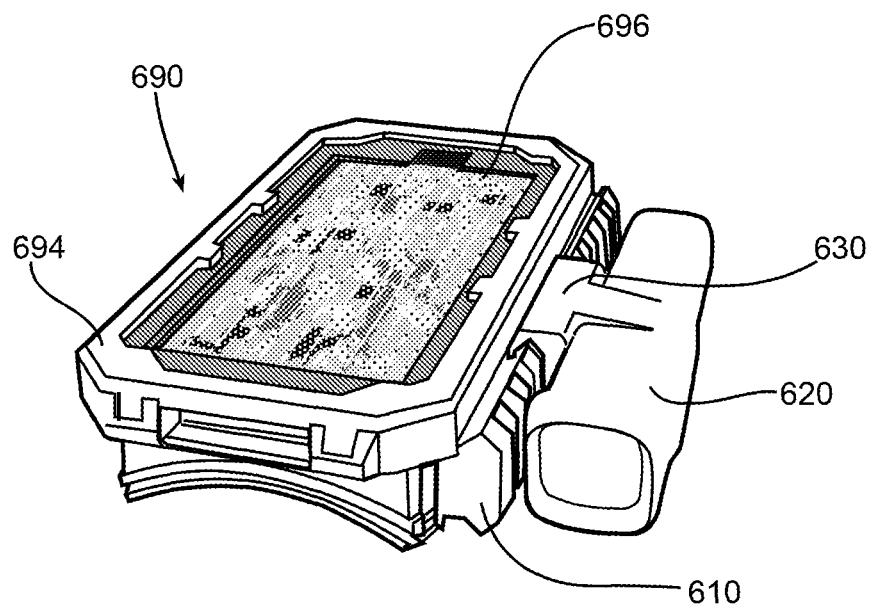

FIGS. 6A and 6B are perspective views of additional embodiments of a device mount further comprising a rail system 610. The embodiment of the device mount 690 depicted in FIGS. 6A and 6B is designed to accommodate a smartphone 696, but persons of ordinary skill in the art will understand that the device mount 690 may be designed to accommodate other electronic devices, as well as embodiments of a map module assembly such as those depicted in FIGS. 3-4. Referring to FIGS. 6A and 6B, the device mount 690 comprises an upper receiver 694, which further comprises a rail system 610 on one or more sides of the upper receiver 694. In FIG. 6B, a flashlight 620 with a rail adapter 630 is coupled to the rail system 610. Persons of ordinary skill in the art will understand that the rail system 610 may accommodate the attachment of other tools and devices that are useful to the user such as laser pointers, etc.

An alternative embodiment of the tensioning system 180 of FIG. 1 is a rack and pinion assembly (not shown) in which one or more dials with teeth engage with one or more geared straps to loosen or tighten the geared straps about the user's appendage when the dial is turned. The level of adjustability of the rack and pinion tensioning assembly depends largely on the size of the teeth on the dial and the size of the gears on the geared straps. A larger number of finer teeth translates to a greater level of adjustability and vice versa. The rack and pinion tensioning system may use a single geared strap coupled with an elastic band, which allows for additional appendage mobility and fine movements. The rack and pinion tensioning system may further utilize a spring loaded mechanism to create a lock so that the dial is immobilized in the desired position. The rack and pinion tensioning system also provides a "closed loop" system that allows the user to easily attach and remove the arm-mounted display apparatus without disassembling the apparatus components.

Although this invention has been described with respect to certain preferred embodiments, various other embodiments and various changes and modifications to the disclosed embodiment(s) will become apparent to those skilled in the art. All such other embodiments, changes, and modifications are intended to come within the spirit and scope of the appended claims.

What is claimed is:

1. An appendage-mounted display apparatus for mounting on a user's appendage, the appendage-mounted display apparatus comprising:
   an upper panel including a first open end and a second open end comprising an upper cage, a base plate, upper structural mesh-coated foam, and an upper grip;
   a lower panel comprising a lower cage, lower structural mesh-coated foam, a lower grip, and a closed-loop laced tensioning system coupled to a lower panel exterior surface, wherein the lower panel is configured to be nested within the first open end and the second open end of the upper panel, the closed-loop laced tensioning system being configured to pull the upper panel and the lower panel substantially radially inward toward the user's appendage such that a uniform level of compressive force about the user's appendage is achieved; and
   a device mount, wherein the device mount is coupled to an upper panel exterior surface, the device mount being further coupled to the base plate.

2. The appendage-mounted display apparatus of claim 1 wherein a combination of the upper panel and the lower panel forms a substantially frustoconical geometry.

3. The appendage-mounted display apparatus of claim 1 wherein the upper cage and upper mesh-coated structural foam further comprise a plurality of guide clamps and wherein the closed-loop tensioning system further comprises a plurality of laces and a tensioning knob, wherein the laces are coupled to the tensioning knob and to the lower panel and the upper panel, the laces being routed through the guide clamps, wherein the laces are configured such that the upper panel and lower panel concentrically tighten or loosen around a user's appendage when the tensioning knob is turned.

4. The appendage-mounted display apparatus of claim 1 wherein the closed-loop tensioning system further comprises a rack and pinion assembly.

5. The appendage-mounted display apparatus of claim 1 wherein the device mount further comprises a smartphone mount.

6. The appendage-mounted display apparatus of claim 1 wherein the device mount further comprises a map module assembly.

7. The appendage-mounted display apparatus of claim 6 wherein the map module assembly is flat.

8. The appendage-mounted display apparatus of claim 6 wherein the map module assembly is curved.

9. The appendage-mounted display apparatus of claim 6 wherein the map module assembly further comprises optics.

10. The appendage-mounted display apparatus of claim 6 wherein the map module assembly further comprises a map cover, the map cover being hingeably coupled to at least one portion of the device mount.

11. The appendage-mounted display apparatus of claim 1 wherein the device mount further comprises a rail system.

\* \* \* \* \*